(12) United States Patent
Keen

(10) Patent No.: US 8,309,210 B1
(45) Date of Patent: Nov. 13, 2012

(54) PRINTED WIRING BOARD PAD CRATERING INHIBITOR

(75) Inventor: Roy M. Keen, Cedar Rapids, IA (US)

(73) Assignee: Rockell Collins, Inc., Cedar Rapids, IA (US)

( * ) Notice: Subject to any disclaimer, the term of this patent is extended or adjusted under 35 U.S.C. 154(b) by 91 days.

(21) Appl. No.: 12/880,256

(22) Filed: Sep. 13, 2010

(51) Int. Cl.
*B32B 3/00* (2006.01)
*H05K 1/00* (2006.01)

(52) U.S. Cl. .............. 428/209; 428/320.2; 428/325; 428/327; 174/258; 361/746; 361/750

(58) Field of Classification Search .......... 174/250–258; 428/209, 320.2, 325, 327; 361/746, 750
See application file for complete search history.

(56) References Cited

U.S. PATENT DOCUMENTS

| | | | | |
|---|---|---|---|---|
| 4,886,699 A | * | 12/1989 | Carroll et al. ............. | 442/235 |
| 5,126,192 A | * | 6/1992 | Chellis et al. ............. | 428/323 |
| 5,368,921 A | * | 11/1994 | Ishii et al. ................. | 442/232 |
| 5,670,250 A | * | 9/1997 | Sanville et al. ............ | 428/323 |
| 5,972,811 A | * | 10/1999 | St. Lawrence et al. ..... | 442/237 |
| 5,981,041 A | * | 11/1999 | Ikegaya et al. ............ | 428/209 |
| 6,124,220 A | * | 9/2000 | Nakata et al. .............. | 442/175 |
| 6,211,320 B1 | * | 4/2001 | Dershem et al. ........... | 526/329.1 |
| 6,863,962 B2 | * | 3/2005 | Nakatani et al. ........... | 428/209 |
| 7,547,849 B2 | * | 6/2009 | Lee et al. .................. | 174/258 |
| 7,658,988 B2 | * | 2/2010 | Lin et al. ................... | 428/209 |

OTHER PUBLICATIONS

Wikipedia, Printed Circuit Board, Jun. 12, 2010.

* cited by examiner

*Primary Examiner* — Cathy Lam
(74) *Attorney, Agent, or Firm* — Donna P. Suchy; Daniel M. Barbieri

(57) ABSTRACT

A laminate for a printed wiring board (PWB) in which the laminate has a resin system containing a binder. The binder is made of ultra-fine binding particles that reinforce the resin system thereby reducing adhesive and cohesive failure of the laminate. The particles in addition to reducing occurrences such as pad cratering, eyebrowing, and tail-cracking, have the benefits of increasing thermal heat transfer and reducing resin shrinkage. The particles are preferably the same material as a reinforcing material contained in the laminate which can be a woven glass.

16 Claims, 6 Drawing Sheets

PRINTED WIRING BOARD PAD CRATERING INHIBITOR

BACKGROUND

Printed wiring board (PWB) laminates are typically composed of an electronic grade woven glass impregnated with a resin system. If the laminate is fully cured, it is called "C-stage," while partially cured laminates are known as "B-stage" or "pre-preg." A PWB is typically made by alternating layers of B-stage and C-stage laminate.

Originally, the resin systems were designed to withstand three major thermal excursions including the bonding of copper foil to the resin impregnated glass cloth, lamination of multiple layers, and the soldering of components to the PWB. Assembly of PWB designs today often require multiple thermal exposures through lamination, solder reflow, and rework/repair. In all, it is not atypical for a laminate to experience numerous high temperature thermal excursions. The effects of these thermal exposures are cumulative and traditional resin systems as well as current resin systems experience thermal breakdowns.

In addition to the increased number of thermal exposures, the use of lead-free solder has lead to increased thermal breakdowns. First, the solder reflow temperatures associated with lead-free solder are approximately forty degrees Celsius higher than traditional tin-lead solder reflow temperatures. Secondly, lead-free solder joints are stiffer than tin-lead solder joints. These two factors, along with the increased number of thermal exposures, transfer more strain into the PWB structure, which in turn, leads to resin shrinkage and fracture (e.g. tail cracking, eyebrowing, delamination, pad cratering).

These problems mostly occur in complex designs; however, even a single lamination is susceptible. The problem of resin fracture seems to occur more frequently with bismaleimide triazine (BT) than glass epoxy resin. As use of BT boards evolved, it became common to build PWB made from glass epoxy inner layers and BT outer layers. This mixed dielectric was lower cost but some applications still require a pure or high percentage BT content. New PWB designs today frequently employ new resin systems. Sometimes these new materials exhibit fracture. Additionally, today's handheld electronic devices are constantly subjected to high stresses and strains which are thermally or mechanically induced shocks occurring during use in their end-use environment. These stresses which can be caused by dropping the devices, sometimes causes the enclosed printed wiring assembly (electrical components soldered on to a PWB) to exhibit pad crater failures. The component, solder attached to the PWB copper pad, mechanically breaks in the PWB or away from the PWB due cracking of the resin under the PWB copper pad resulting in catastrophic electrical failure.

It is therefore an object of the present invention to provide a laminate which will be less susceptible to failures and latent damage including tail cracking, eyebrowing, and pad cratering.

It is further an object of the present invention to provide a printed wiring board which will be less susceptible to failure and latent damage caused by thermal exposure and lead-free solder.

It is another object of the present invention to provide a method for making a laminate which will be less susceptible to failure and latent damage caused by thermal exposure and lead-free solder.

SUMMARY OF THE INVENTION

In order to help minimize certain failures customary in PWB and specifically the laminates utilized in PWBs, binding particles are added to the resin system of the laminate. The binding particles help prevent failures as well as latent damage such as cracking of the laminate which may not be detected since complete failure is not observed by the naked eye.

A typical laminate includes a resin system or matrix, a reinforcing material, which can be a fibrous material, and a conducting material. The fibrous material can be a continuous glass fiber such as a woven glass. The conducting material is typically copper which frames the resin system to form a cured double sided metal dielectric.

In the present invention, a binder is added to the resin system. The binder reinforces the resin system by preventing adhesive and cohesive failure while increasing thermal heat transfer. The addition of the binder increases resistance to resin shrinkage, fracture and embrittlement.

Although the binder particles can be a variety of materials including diamond dust and nanotechnology fibers, the preferred binder is one which contains a material in common with the reinforcing material. For example, a resin system containing a woven glass would have a binder made of ground glass cloth powder. The ground glass comprises binder particles that would be added to the resin system. Smaller binder particles are preferable and particles that are approximately 10 to the −8 cm in size may allow for the most beneficial effects.

DETAILED DESCRIPTION

Figure 1:
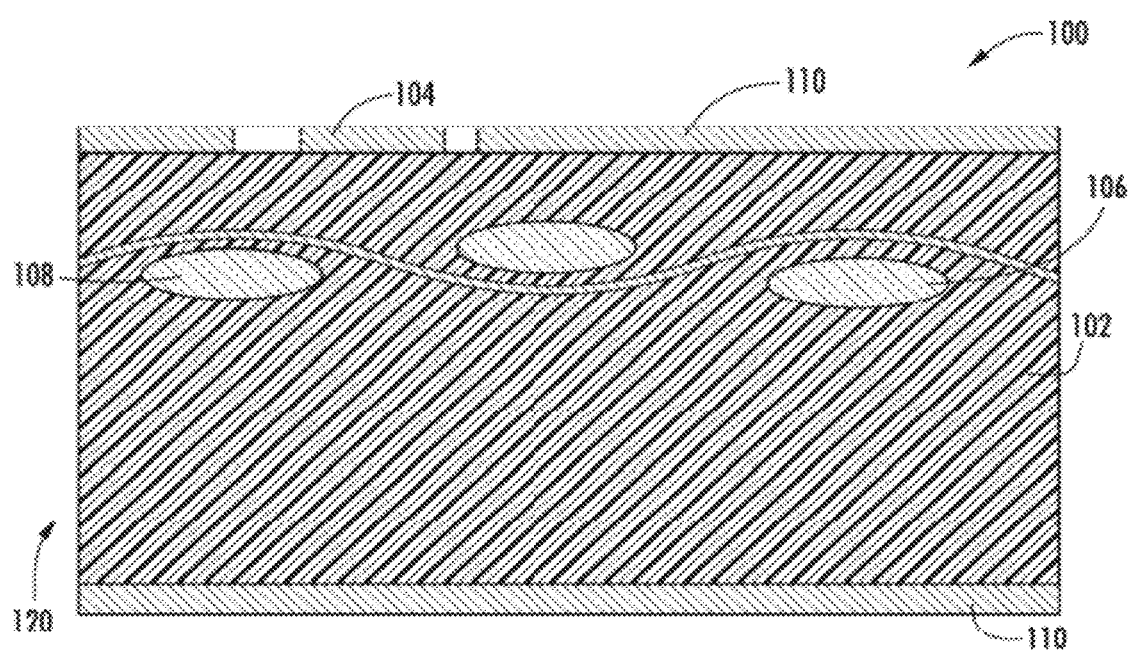
FIG. 1 is a cross sectional view of a laminate.

Now referring to the drawings, FIG. 1 shows a typical laminate 100 comprising a resin system 102, a conducting material 104, and a reinforcing material 106. The reinforcing material 106 can be a woven glass 108 or a fibrous material and the conducting material 104 can be a metal 110 such as copper. The woven glass 108 is impregnated within the resin system 102. The laminate 100 can be partially or fully cured to form a double sided metal dielectric 120. The laminate 100 can be integrated into a printed wiring board (PWB) by using layers of the laminate 100. The layers of the PWB can be in the form of an alternating cured and pre-preg arrangement.

Figure 2:
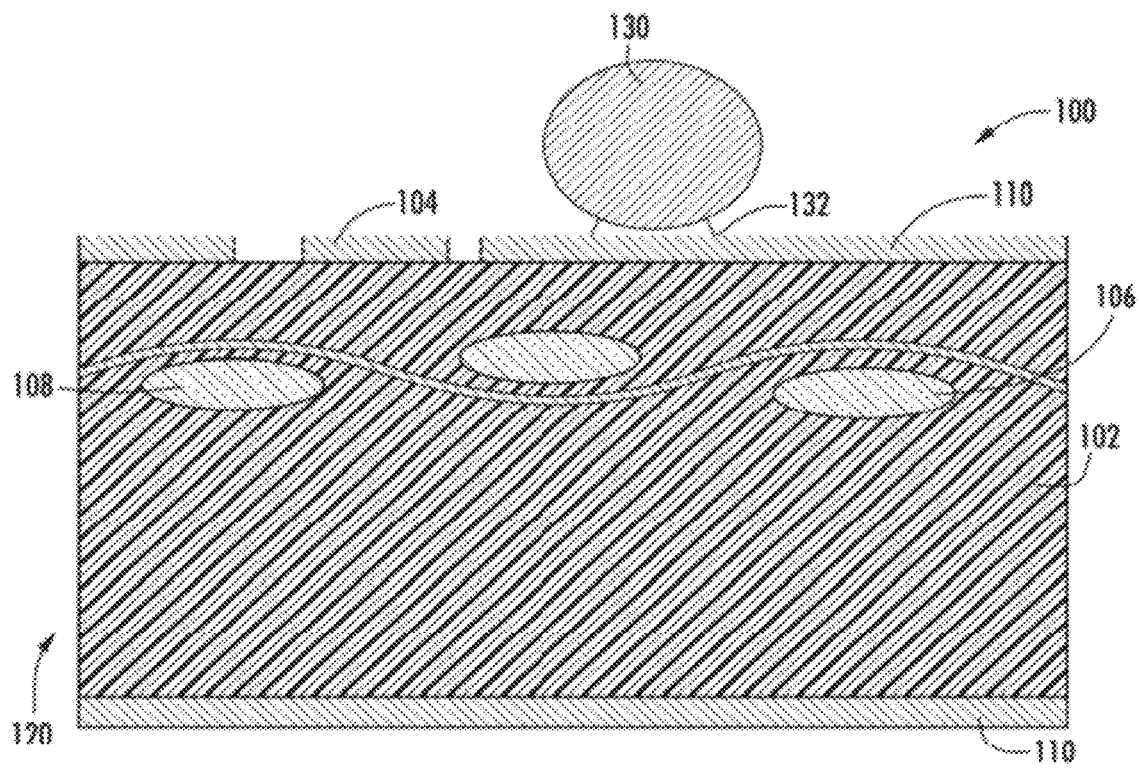
FIG. 2 is a cross sectional view of a laminate with a connecting pad and solder joint attached.
Figure 3:
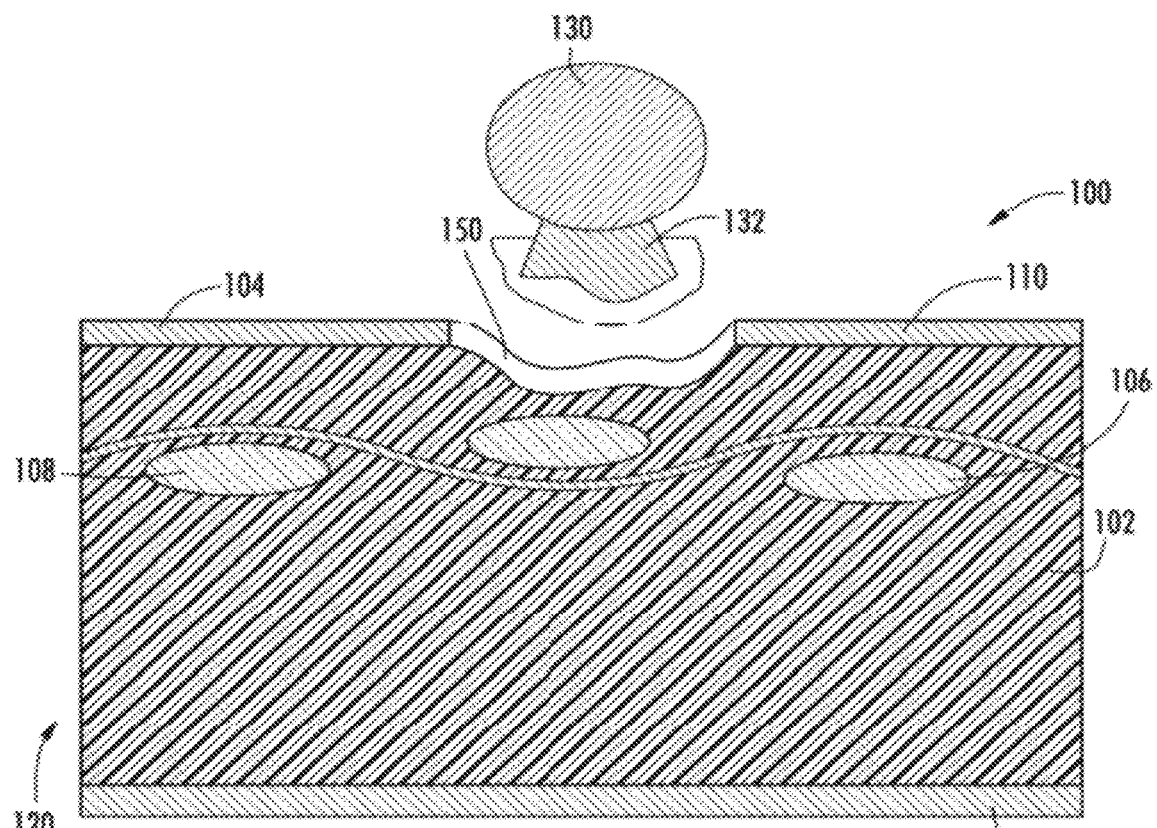
FIG. 3 is a cross sectional view of a laminate after a pad cratering has contributed to the loss of the solder joint.

FIG. 2 shows a laminate 100 with the structures detailed in FIG. 1, but also including a solder joint 130 and a connecting pad 132. The solder joint 130 is attached to the connecting pad 132 which in turn is attached to the conducting material 104. FIG. 3 shows a failure of the laminate 100 typical of a lead-free solder. The failure shown leaves a pad cratered site 150 which has removed a portion of the laminate 100. In addition to observable failure such as the pad crater shown in FIG. 3, the additional number of solder reflow cycles and the increased temperatures associated with lead-free solder reflow can cause breakdown of the laminate material which may eventually lead to pad craters.

Figure 4:
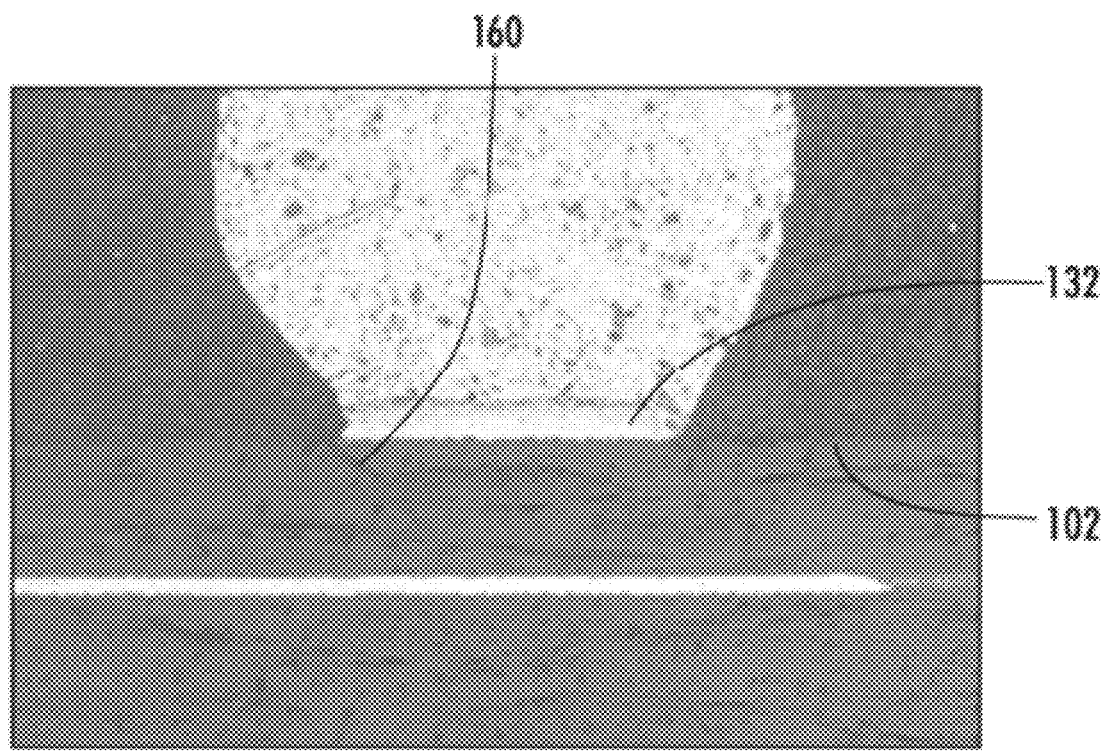
FIG. 4 is a SEM photo of a laminate showing a crack propagation.
Figure 5:
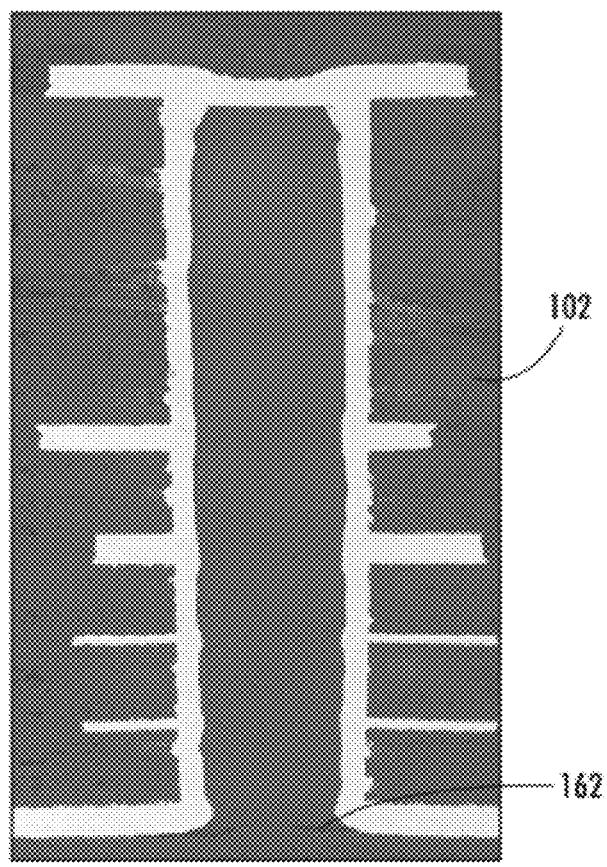
FIG. 5 is a SEM photo of a laminate showing a tail crack.
Figure 6:
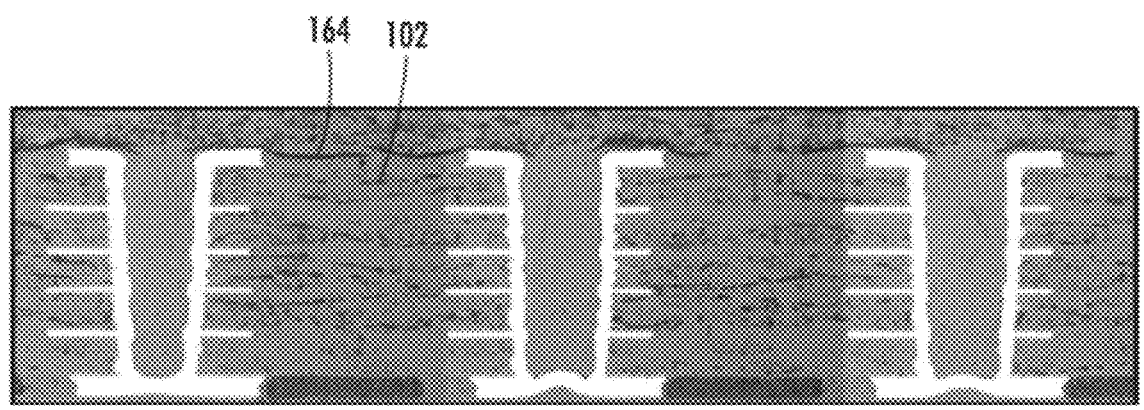
FIG. 6 is a SEM photo of a laminate showing eye browing.

A breakdown in the laminate is shown in the SEM photos of FIGS. 4, 5, and 6. A crack 160 is shown in the resin system 102 under a pad 132. Regions containing a crack 160 may lead to pad cratering during repair/reflow work. Other breakdowns of the laminate include tailcracks 162 as shown in FIG. 5, eyebrows 164 as shown in FIG. 6, and general delamination which can be caused by the numerous thermal cycles and the higher temperatures associated with lead-free solder.

Figure 7:
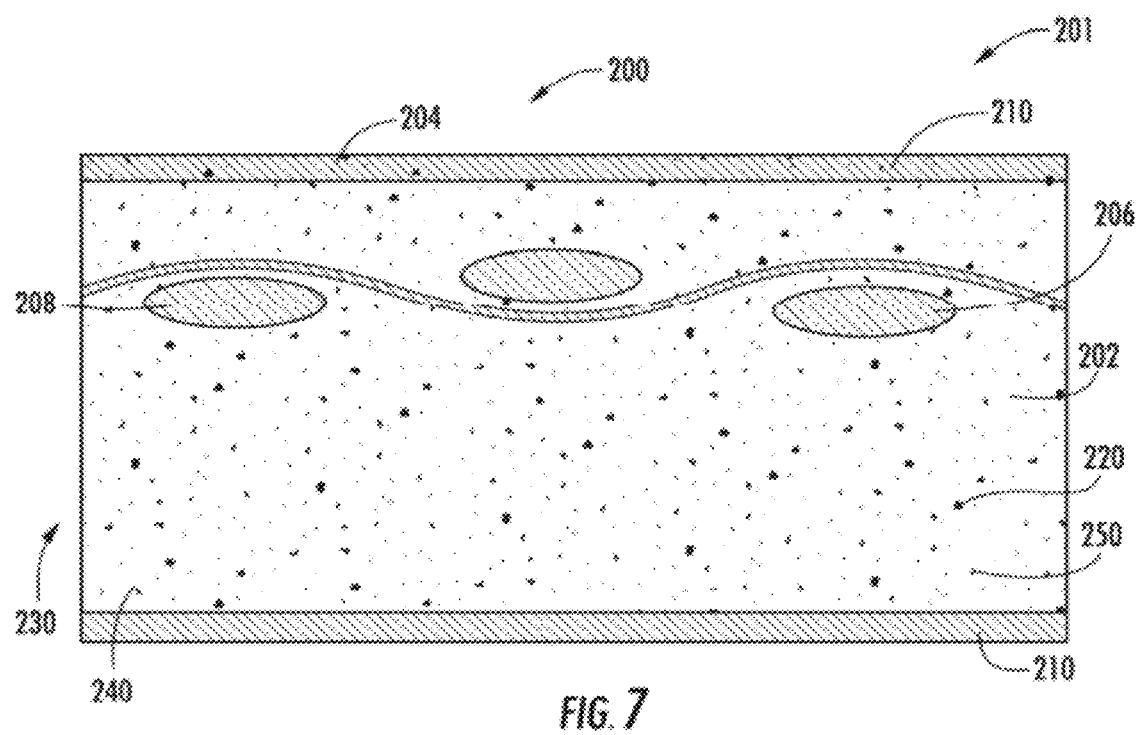
FIG. 7 is a cross sectional view of an embodiment of the invention in which binding particles are added to the resin system.

FIG. 7 shows an embodiment of the invention which reduces pad cratering by the addition of a binder 220 to the laminate 200 of a printed wiring board 201. The printed wiring board 201 comprises the laminate 200. Much like the laminate depicted in FIG. 1, the laminate 200 comprises a resin system 202, a conducting material 204, and a reinforcing material 206. The reinforcing material 206 can be a fibrous material such as a woven glass 208 and the conducting material 204 can be a metal 210 such as copper. The woven glass 208 is impregnated within the resin system 202 under the conducting material 204. The laminate 200 can be partially or fully cured to form a double sided metal dielectric 230. The laminate 200 can be integrated into the printed wiring board (PWB) 201 by using layers of the laminate 200.

In addition to the elements above, the resin system 202 of the invention comprises the binder 220. The binder 220 is added to the resin system 202 in order to reduce the adhesive and cohesive failure of the laminate 200. The addition of binder 220 also allows the resin system 202 to have a coefficient of thermal expansion (CTE) more similar to the lead-free solder joints connecting the PWB 201 to packages (not shown). The more similar CTE of the resin system 202 helps reduce the occurrence of the metal 210 and/or part of the resin system 202 being ripped off the PWB 201 during temperature excursions.

The binder 220 is made up of binder particles 240. The particles 240 can be a variety of materials including glass cloth powder, diamond dust, and/or nano-technology fibers. The preferred embodiment utilizes a material which is also contained in the reinforcing material. As shown in FIG. 7, the reinforcing material 206 can be a woven glass 208 made of a continuous glass fiber. The binder 220, and hence particles 240, are made of glass particles 250 made from grinding the woven glass 208 or glass. A range of binder particle sizes can be used; however, preferably the particles 250 are ground to a relatively small size, approximately 10 to the −8 centimeters.

The particles 250 can be homogeneously incorporated into the resin system 202. The particles 250 can be added to a non-cured, partially cured, or cured laminate. Furthermore, the binding particles 250 can be incorporated into a PWB consisting of both cured and non-cured laminate layers having one or more conducting layers. The conducting layers can be a metal such as copper which form a double sided metal dielectric. The addition of the particles 250 thereby reduces adhesive and cohesive failure of the laminate 200. The laminate, therefore, is less subject to delamination, shrinkage, eyebrowing, tail cracking and failures such as pad cratering.

Having thus described the invention in connection with the several embodiments thereof, it will be evident to those skilled in the art that various revisions can be made to the several embodiments described herein with out departing from the spirit and scope of the invention. It is my intention, however, that all such revisions and modifications that are evident to those skilled in the art will be included with in the scope of the following claims. Any elements of any embodiments disclosed herein can be used in combination with any elements of other embodiments disclosed herein in any manner to create different embodiments.

What is claimed is:

1. A laminate for a printed wiring board comprising:
a conducting material;
a resin system;
a reinforcing material impregnated within the resin system;
the resin system containing a binder,
the binder comprising binding particles,
the binding particles reinforce the resin system thereby reducing adhesive and cohesive failure of the laminate;
the particles are approximately $1 \times 10^{-8}$ centimeters in size.

2. The invention of claim 1 wherein:
the reinforcing material is a fibrous material,
the fibrous material is a woven glass,
the woven glass is a continuous glass fiber,
the resin system is homogeneous;
the laminate is at least partially cured,
the laminate is a cured dielectric having one or more conducting layers,
the conducting material is metal;
the particles contain a material in common with the reinforcing material,
the particles are glass.

3. The invention of claim 1 wherein:
the particles are diamond dust.

4. The invention of claim 1 wherein:
the particles contain a material in common with the reinforcing material.

5. The invention of claim 4 wherein:
the laminate further comprises a woven glass.

6. The invention of claim 5 wherein:
the woven glass is impregnated within the resin system.

7. The invention of claim 6 wherein:
the particles are homogeneously incorporated into the resin system.

8. The invention of claim 7 wherein:
the laminate is cured.

9. The invention of claim 7 wherein:
the laminate contains a non-cured layer.

10. The invention of claim 8 wherein:
the laminate is a cured dielectric having one or more conducting layers.

11. A printed wiring board comprising:
a laminate;
a conducting material;
the laminate comprising a resin system;
the resin system containing a binder,
the binder comprising binding particles,
the particles are approximately $1 \times 10^{-8}$ centimeters in size;
the particles reinforce the resin system thereby reducing adhesive and cohesive failure of the laminate.

12. The invention of claim 11 wherein:
a reinforcing material is impregnated within the resin system;
the particles contain a material in common with the reinforcing material.

13. The invention of claim 12 wherein:
the reinforcing material comprises a woven glass,
the binding particles are glass.

14. The invention of claim 13 wherein:
the laminate is at least partially cured.

15. A laminate for a printed wiring board, comprising:
a conducting material;
a resin system;
a reinforcing material impregnated within the resin system;
the resin system containing a binder;
the binder comprising binding particles;

the binding particles reinforce the resin system thereby reducing adhesive and cohesive failure of the laminate;

the particles are diamond dust which are approximately $1 \times 10^{-8}$ cm in size.

16. The invention of claim 15, wherein:

the reinforcing material is a fibrous material;

the fibrous material is a woven glass;

the woven glass is a continuous glass fiber;

the laminate is a cured dielectric having one or more conducting layers;

the conducting material is metal.

* * * * *